nected only to the transfer-in gate 22a while the control conductor 32a is connected to the transfer-out gate 30a and to the second transfer-out gate 24a, the latter being connected to an annihilator 56.

In the operation of this embodiment in response to the in-plane magnetic field, bubbles, after having been written in at the transfer-in port to 22a, flow continuously in the loop 12a and upon the application of a suitable pulse applied to the control line 32a, are transferred out of the loop 12a so as to propagate along the line of propagate elements 36a to the passive replicator 34a where each bubble is split; one portion going to the merge port 40a via line 42a and the other portion traveling along 44a to the transfer-out gate 24a. On the other hand, if the control line 32a is not pulsed at the time the bubble reaches the transfer-out port 24a, the bubble will continue along the line of propagate elements 44a back to the merge point 46a where it will again reenter the loop 12a. If the transfer-out port 24a is, however, activated by an application of a pulse on the conductor 32a, the bubble is automatically transferred to the annihilator 56 via a line of propagate elements 58. In the meantime, the other portion of the replicated bubble travels along the line 42a to the merge port 40a and along the line 38a to the detector 52 where it is sensed.

At this point it should be noted that, in this embodiment, the spacing between the passive replicator and the two transfer-out ports 30a and 24a is preselected and the timing in response to the rotating magnetic field is determined by the sides and number of folds such as 14a–18a. Again, since only one control line is required for the two transfer-out ports and only one line for the transfer-in gate 22a, the lines may be made of wider conductor material over much of its length thus reducing impedance and voltage requirements of the control circuit. Again, it should also be noted that the bubble storage area which comprises a plurality of storage loops, such as 12a, being separated from the replication and annihilation area and from the detector area, permits different current element periods to be used to simplify alignment requirements. This is illustrated in the drawings by the dotted lines surrounding the passive replicator and annihilator area and indicated by the reference number 54a.

Turning now to FIG. 3, this organization utilizes a similar folded loop configuration 12b but the replicator 34b, again, a passive replicator, is located in the loop 12b itself so that bubbles are automatically replicated and portion thereof propagated to a transfer-out gate 24b along a propagate element 36b. Transfer-out gate 24b is in turn connected by a line of propagate elements 58b to an annihilator 56b. However, in this embodiment, in lieu of the merge point 46, transfer-out gate 30b is located in the loop 12b and connected to a second annihilator 62 by a line or propagate elements 64.

Again, in this embodiment, for simplicity of description, those elements having the same functions as the functions described in connection with the elements of FIGS. 1 and 2 are given the same reference numeral except for the suffix "b".

In the operation of the third embodiment of FIG. 3, after the bubble is replicated at the passive replicator 34b, one portion is transferred to the line 36b while the other portion is allowed to continue along the loop 12b to the transfer-out gate 30b. If the transfer line 32b is not activated, the bubble will continue in the loop 12b and, in the meantime, the portion of the bubble on line 36b. Upon reaching the transfer port 24a and if the conductor 32b is not pulsed, the bubble portion will propagate to merge port 40b and line 38b to be read by detector 52b.

On the other hand, if the conductor 32b is activated when the bubble reached transfer-out port 24b, the bubble will be transferred along the line of propagate elements 58b to the annihilator 56b and at the same time the bubble i.e., the replica of the bubble in annihilator 56b, will be at transfer-out port 30b and will be transferred to line 64 and onto the annihilator 62. Again, utilizing only one transfer line, the two portions of the replicate bubble may be annihilated by the activation of the transfer-out ports simultaneously if a "clear" is the desired signal.

Now turning to FIGS. 4 and 5, there is shown two in-plane folded storage loop configurations utilizing the teachings of this invention to show how a loop can be configured to adjust the propagate tme between the transfer-in port such as 22c and 22d and the transfer-out ports such as 30c and 30d for proper timing sequence to a replicator and other gating functions. In the Figures, as in the prior Figures, those functional elements having the same function as in the prior Figures are given the same reference numeral except with a suffix "b" or "c". After description of the foregoing FIGS. 1–3, it is not believed that a description of the operation of these Figures is necessary.

Turning now to FIG. 6, there is shown a multi-inplane folded loop configuration utilizing the teachings of this invention to show how a loop can be configured using an active replicator and a transfer-in gate so that the length of the loop can be adjusted independent of the number of loop folds thus achieving a fixed loop delay and allowing an independent choice of the number of folds for reducing a gate conductor impedance while increasing the space for more complex gating elements. Note, in this Figure, there is additional space provided between the transfer-in port 22e and the initial merge port 46e where bubbles enter into loop 12e and between the active replicate/transfer-out gate 60 and the merge port 42e. Again, in this Figure as in the prior Figures those functional elements having the same function as in the prior Figures are given the same reference numeral except for a suffix e. After description of the foregoing FIGS. 1–5, it is not believed that description of the operation of this Figure is necessary. This Figure does show, however, in addition to the active replicator, the fact that the gating functions can be located on one side of each loop.

From the foregoing, it can be seen that the performance of a chip can be optimized in a number of ways. First, with a folded-loop configuration as disclosed herein bubble manipulation means, such as a transfer-in ports and the transfer-out ports, are not located at a corner turn (i.e., the 180 degrees reversal area of the conventional storage loop) so that additional space is available for higher magnetic margin transfer elements, replicate elements and control conductors with less current caused field interaction with the adjacent propagate elements. Also, the use of a high current for replicating a bubble can be eliminated in those embodiments utilizing a passive or low current replicator, and the conductor thicknesses can be reduced, thus reducing the electromigration failures probability. Note, also, again, with the bubble storage area separated from the replicator, merge and detector areas, different current element periods can be used to ease mask alignment requirements. Also, a selection of various drive field

RANDOM ACCESS MOS MEMORY CELL USING DOUBLE LEVEL POLYSILICON

This application is a continuation-in-part of my earlier filed copending applications Ser. No. 648,594, filed Jan. 12, 1976, and Ser. No. 722,841, filed Sept. 13, 1976.

BACKGROUND OF THE INVENTION

This invention relates to semiconductor memory devices and methods of manufacture thereof, and more particularly to an N-channel silicon gate MOS RAM cell.

Semiconductor memory cells of the one-transistor type are widely used in N-channel silicon gate MOS RAM's as described in U.S. Pat. No. 3,909,631, issued Sept. 30, 1975 to N. Kitagawa, and pending applications Ser. No. 682,687 filed May 3, 1976 by Kitagawa and McAlexander, now abandoned; and Ser. No. 691,735 filed June 1, 1976 by White, McAdams and Redwine, now U.S. Pat. No. 4,081,701, all assigned to Texas Instruments as well as in Electronics, Sept. 13, 1973 at pp. 116-121, Feb. 19, 1976 at pp. 116-121, and May 13, 1976 at pp. 81-86. The most widely manufactured device of this type contains 4096 or $2^{12}$ bits, referred to in the industry as a "4K RAM," or more recently the 16K RAM with 16384 bits is coming into production. It is expected that 64K and 256K devices will be introduced. The costs in the production of semiconductor devices are such that most of the expense is in bonding, packaging, testing, handling, and the like, rather than the cost of producing the actual circuitry in the small chip of silicon. Thus, any circuit which can be contained within a chip of a given size, for example, 30,000 square mils, will cost about the same as any other. By forming "16K" or 16384 ($2^{14}$) memory cells or bits in a chip, large economies in the cost per bit can result compared to a device containing 4K bits, if reasonable yields are obtained. As the size of a chip increases, the yield decreases, so that at sizes above about 180 mils on a side the advantages are outweighed by reduction in yield. Accordingly, it is desirable to reduce the area occupied by each bit or cell in a RAM. Using photolithographic processes with ultraviolet light and glass masks as in now standard, cell sizes of about one square mil or slightly less are obtained. To produce 64K and 256K RAM's, cell sizes of perhaps 0.2 or 0.3 square mil per bit must be obtained.

One-transistor cells in MOS integrated circuits employ storage capacitors of the type having a silicon oxide dielectric as set forth in U.S. Pat. No. 3,350,760, issued Nov. 7, 1967, to Jack S. Kilby, assigned to Texas Instruments. These may be of the so-called gates type, i.e., voltage dependent, and may have ion implanted regions thereunder as set forth in copending applications Ser. No. 645,171, filed Dec. 29, 1975 by Gerald D. Rogers, now abandoned, or Ser. No. 722,841, filed Sept. 13, 1976 by C-K Kuo, both assigned to Texas Instruments.

The magnitude of the storage capacitor in a one-transistor cell should be large so that the time between refresh cycles is long, and also so that a good signal is produced in the bit line when a cell is accessed. Large arrays such as 128×128 or 256×256 mean that the bit lines are long and have high capacitance, reducing the ratio of storage capacitance to bit line capacitance, thus tending to reduce the signal. Also, large arrays dictate small cell area, thus small capacitors. The capacitance can be increased by reducing the oxide dielectric thickness, but this is detrimental to yield. In a dynamic RAM using one-transistor cells, the reliability of the storage capacitor is critical, since the capacitors constitute a major portion of the total thin oxide area of the chip. Generally, reliability and yield of a device are both inversely related to the area of the chip occupied by thin oxide. The capacitor dielectric areas are more critical than the gate areas of the transistors because they are larger and can be under a high electric field stress. Life test data on N-channel MOS dynamic RAM devices shows that 80 to 90% of reliability related failures are due to oxide defects in the storage capacitors. By increasing the capacitor area, the electric field intensity in the storage capacitor dielectric for a given charge stored can be reduced so the reliability is increased. Alternatively, by reducing the field intensity, the oxide can be made thinner for a given yield so that the capacitance per unit area may be increased, allowing a reduction in overall thin oxide area.

Increase in capacitance value for a given cell area is accomplished by an anisotrophically-etched V-groove as disclosed in copending applications Ser. No. 763,780, filed Jan. 31, 1977 by G. R. Mohan Rao et al, and Ser. No. 765,181, filed Feb. 3, 1977 by G. R. Mohan Rao and C-K Kuo, with assigned to Texas Instruments. The V-groove is also useful in creating a very short channel MOS transistor with accurately controlled threshold voltage by a double ion implant process with anisotropic etch as disclosed in IEEE Journal of Solid State Circuits, February 1977, pp. 3-10.

The principal object of this invention is to provide an improved transistor and storage capacitance combination for a random access memory cell, particularly a very small area cell. Another object is to provide an improved method of making N-channel silicon gate RAM devices. A further object is to provide an MOS RAM cell of smaller size made by a process compatible with existing N-channel silicon gate manufacturing methods.

SUMMARY OF THE INVENTION

According to the invention, an N-channel silicon gate MOS memory cell is provided which used two levels of polycrystalline silicon. The first level provides the upper plate of the storage capacitors for the cells in a column. This level is connected to a bias voltage supply or Vss and is common to all cells in a column. The second level in part overlies the first and provides the gates of the MOS transistors, and also the X address line or a connection from the gates to an overlying metal strip which is the X address line. One end of the source-to-drain path of the transistor is created by an edge of the inverted region beneath the first level poly, i.e., one side of the capacitor region. This capacitor region may be implanted to lower the voltage needed to invert it.

According to one embodiment of the invention, an improved storage capacitor for the N-channel silicon gate MOS memory cell is provided which uses an anisotropically etched V-shaped depression in the region to increase the effective area of the storage capacitor, and this V-groove also creates the MOS transistor. Above the V-groove, the first level polycrystalline silicon strip, isolated from the surface by a dielectric provides the upper plate of the storage capacitors for all cells in a column, and the area beneath this strip may be ion implanted region to lower the voltage needed to invert this area; this strip is connected to a low voltage bias voltage supply or to ground. An area of the second level polycrystalline silicon also provides the gate of an MOS transistor which functions as the access device and the second level poly provides the X address line; the first and second levels are separated from one another by a thin dielectric.

THE DRAWINGS

The novel features believed characteristic of the invention are set forth in the appended claims. The invention itself, however, as well as other features and advantages thereof, is best understood from the following detailed description of particular embodiments, when read in conjunction with the accompanying drawings, wherein:

Figure 1:
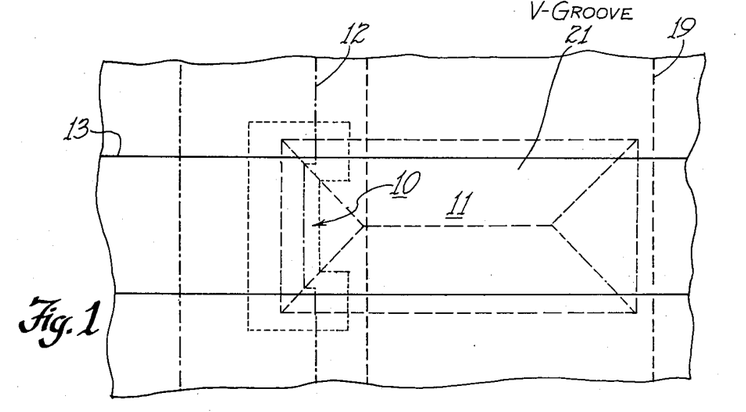
FIG. 1 is a greatly enlarged plan view of a very small area on a semiconductor chip, showing a random access memory cell made according to the invention.

Referring now to FIG. 1, an N-channel MOS RAM cell is shown in plan view according to one embodiment of the invention. This cell would be in an array of perhaps 64K or 65536 like cells on a chip of silicon less than 200 mils on a side. The cell includes a transistor 10 and storage capacitor 11, also seen in the schematic diagram of FIG. 2. A sense or bit line 12 is provided by an elongated N+ implanted region which is a "Y select" line to which one hundred twenty-eight or two hundred fifty-six like cells are connected. A 64K array would include 256 Y lines and 256 X lines. The X line is a second-level polycrystalline silicon row select line 13 which will form the gates of the transistor 10 for all cells in a row of 256.

Figures 2, 3A:
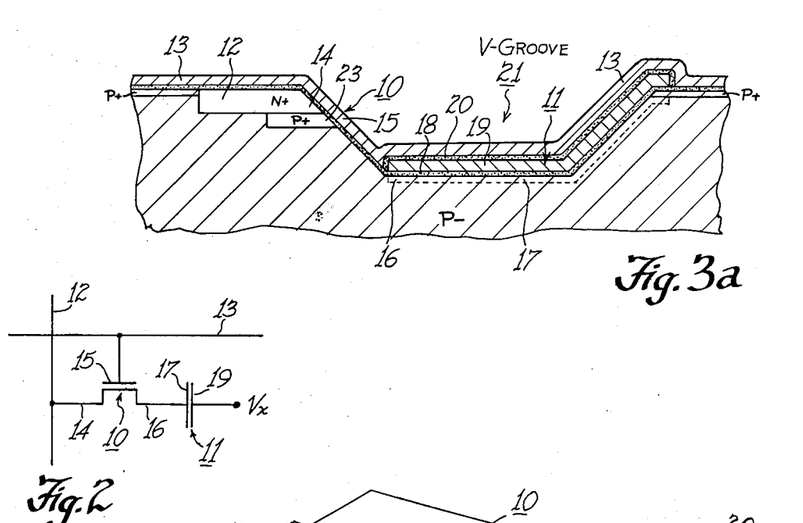
FIG. 2 is an electrical schematic diagram of the cells of FIG. 1.
FIGS. 3a and 3b are sectional views (FIG. 3a being in perspective) of the device of FIG. 1, taken along the lines a—a and b—b of FIG. 1, respectively.
Figure 3B:
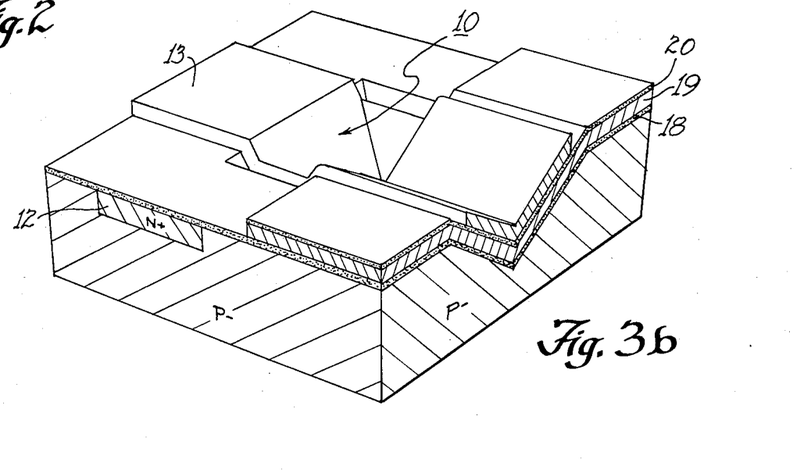

As best seen in FIGS. 3a and 3b along with FIG. 1, each MOS transistor 10 includes an N+ implanted region 14 which is part of the sense line 12, along with a gate 15 created by the second level poly line 13. The drain (or the other end of the source-to-drain path) of the MOS transistor is created in a region 16 which is the left-hand (in FIGS. 1 and 3a) edge of an inversion region 17 beneath the capacitor 11. The region 17 is the lower plate of the capacitor. A thin silicon oxide layer 18 functions as both the gate insulator for the MOS transistor 10 and the dielectric of the capacitor 11. The upper plate of the capacitor is provided by a first-level polycrystalline silicon strip 19 which is connected to a reference potential; preferably, the region 17 inverts with a low voltage or Vss on the line 19, and to accomplish this the doping level of the starting material is low. A layer 20 of silicon oxide separates the first and second levels of polysilicon. No metal level is needed in the array, and no contacts, poly-to-silicon or poly-to-poly, are needed. Although a metal level and contacts would be used in the peripheral circuitry.

An important feature of this embodiment is a V-groove 21 which is formed in the face of the silicon body by anisotropic etching as explained in copending application Ser. No. 763,780, filed Jan. 31, 1977, by G. R. Mohan Rao et al, assigned to Texas Instruments. The <100> crystalline face of a silicon slice, masked with oxide, etches to expose the <111> plane which are at an angle of 54.7 with respect to the original <100> plane. The etch process usually employs hydrogen; it is terminated before the bottom of the V-groove reaches an apex so that a flat bottom is provided. The V-groove functions not only to increase the capacitance value for a given area on the slice, but also to define a channel 23 for the MOS transistor 10. The channel 23 is part of a P+ type implanted region 24; by controlling the implant depth, the channel length can be reliably established at very short distances (for example, 0.1 to 0.5 $\mu$m). Conventional MOS transistors of the type described in the above mentioned Sept. 13, 1973 Electronics article have minimum channel lengths of perhaps 5 $\mu$m. The additional capacitance as a result of the increase area of the side walls of the V-groove is about 70% over what the capacitance would be with a flat surface.

A method of making the cell of FIG. 1 will be described with reference to FIG. 4a-4e. The starting material is a slice of monocrystalline, semiconductor grade silicon which is about 3 inches in diameter and 20 to 40 mils thick; only a very small part 30 of the silicon slice is seen in the FIGURES. The slice is first oxidized in dry Oz or steam at a temperature in the nature of 900° to 1100° C. to create a thin layer 31 of silicon oxide of about 1000 Å. The oxide layer 31 prevents surface damage and out-diffusion during the implanted operations. A shallow P+ channel stop region 32 is first implanted by subjecting the slice to a boron ion beam of about 50 KeV at a dosage about $10^{12}/cm^2$. The channel stop region extends across the entire surface of the slice, although later parts will be etched away at the V-groove or obliterated by a heavier N+ implant. A coating 33 of photoresist is applied and exposed to UV light through a mask prepared to define the sense lines 12. Instead of light, electron beam exposure of a suitable resist may be used as set forth in Bell Laboratories Record, March 1976, pp. 68-73 or Electronic Products, February 1977, p. 17. Smaller geometries or tighter design rules may be obtained using electron beam exposure, and no masks need be physically produced. Masks are a source of low yields because pin holes are created by dust in the photographic process or by contact between the mask and the slice.

As seen in FIG. 3a, the next step is implant of the N+ sense line 12, using the developed resist 33 as an implant mask. For this purpose, phosphorus or arsenic is implanted at 100 KeV to a dosage of about $10^{16}/cm^2$, producing a junction depth of about 0.2 to 0.3 micron, much deeper than the channel stop region 32. Thereafter, as seen in FIG. 3b, another photoresist coating 34 is applied, exposed, and developed to leave a pattern which defines the shape of the P+ region 24. The resist coating functions as an implant mask for a boron implant at 120 KeV to a dosage of about $10^{13}/cm^2$. The region 24 is about 0.6 to 0.8 micron in depth, so the effective channel length is about 0.4 micron or micrometer, more or less, in the completed device after the V-groove is etched. These depths are after an anneal step which may be at 900° to 1000° C. in Ns for at least one-half hour. Thermal oxidation used in subsequent steps may consume some of the surface and drive the N+ and P+ regions deeper; if so this effect is accounted for in selecting beam intensity and dosage for proper device characteristics.

An alternative way of forming the channel stop regions is simultaneously with the P+ implant for the region 24. The resist coating 34 in such case would be patterned to expose all areas where the channel stop is to be placed; that is, channel stop would exist in all areas not occupied by the bit lines 12, transistors 10 and capacitors 11 in the cell array, and usually the channel stop would be spaced slightly from the bit lines, etc., rather than abutting.

Figure 4:
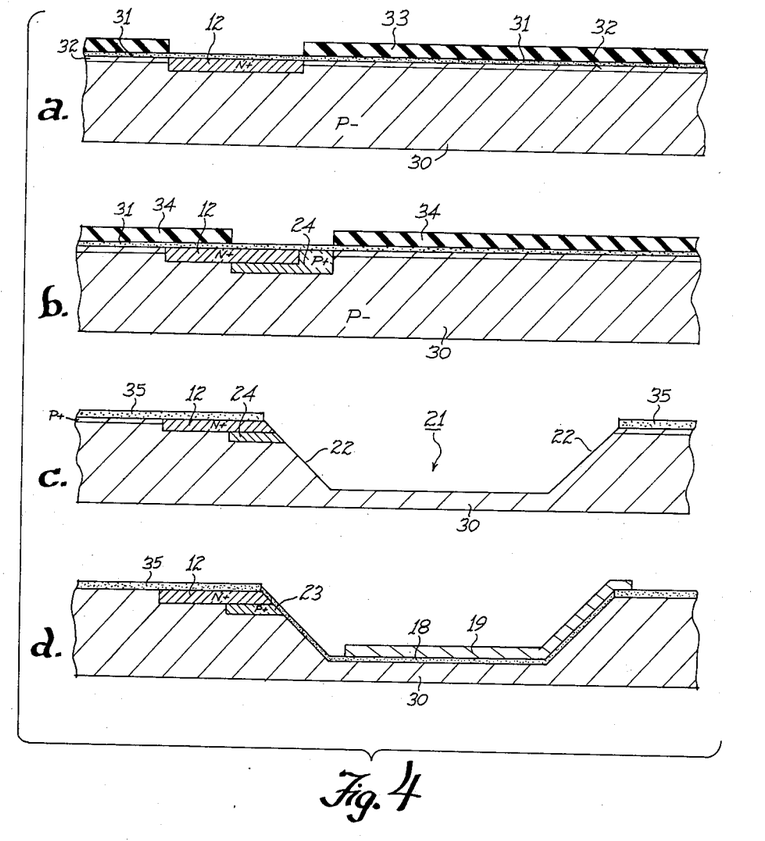
FIGS. 4a-4d are sectional views of the cell of FIG. 1 taken along the line a—a, at various stages in the manufacture thereof.

As the next step in the process, after removal of the photoresist 34, a thermal oxide coating 35 is grown, perhaps 2000 to 5000 Å thickness, then this oxide layer is patterned to expose the area where the V-groove 21 is to be etched. This area may be, for example, about 0.2 mil × 0.4 mil for each cell. As seen in FIG. 4c, the slice is subjected to anisotropic etch to produce the V-grooves. The etch step may employ hydrogen in about 60 to 70% solution in water at 100° C., which removes the <100> face of a silicon body at a rate of about 10 KÅ per minute. After formation of the V-grooves, the slice is subjected to thermal oxidation to produce the oxide layer 18 which has a thickness of about 800 Å.

Referring now to FIG. 4d, the slice is next coated with a first layer of polycrystalline silicon of a thickness of about 0.5 micron, and this layer is patterned using photoresist to leave the Vx strip 19. Just prior to application of first level poly, however, as an alternative, the region 17 may be boron implanted to lower the voltage needed to invert this region, permitting a lower Vx voltage in accordance with my application Ser. No. 722,841.

The first level poly is subjected to thermal oxidation to produce the oxide layer 20, which is at least 1000 Å thick and preferably thicker. This consumes part of the surface of the poly strip 19, and also makes the gate oxide over the channel 23 slightly thicker as all silicon areas will oxide further.

Thereafter, the secnd level polysilicon is deposited at a thickness of about 0.5 micron, and patterned using photoresist to leave only the X address lines 13, as seen in FIGS. 1 and 2a. The fabrication of the cell array is complete, although for other parts of the memory device such as address buffers and latches, decode, input/output circuitry, and the like, it would be necessary to provide a metallization layer. A thick low-temperature oxide coating would be applied and patterned. A protective oxide coating would than be applied, and the slice scribed and broken into individual chips, each about 150 mils on a side and each containing 64K bits of memory. The chips are mounted in dual-in-line packages, as is standard in the industry.

Figure 5:
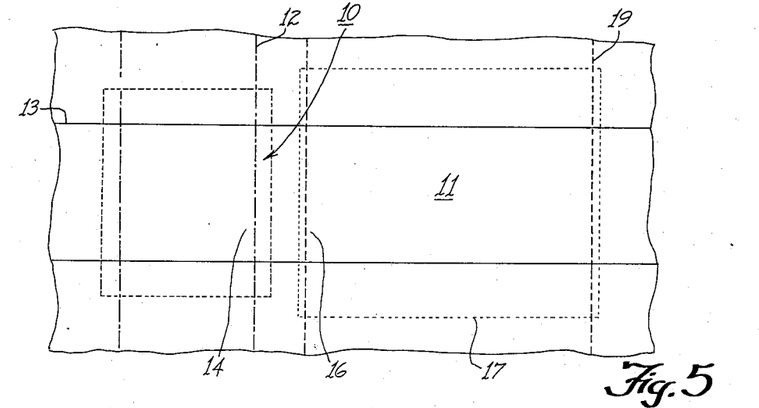
FIG. 5 is a plan view of another embodiment of a double level polysilicon cell similar to FIG. 1 but not using a V-groove.
Figure 6:
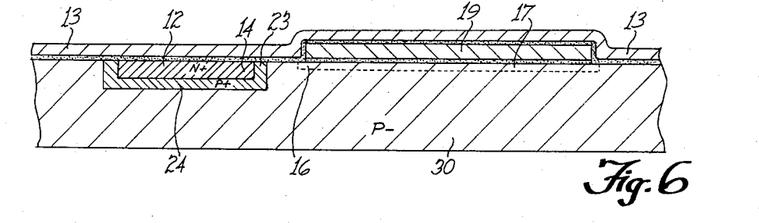
FIG. 6 is an elevation view in section of the device of FIG. 5, taken along the line a—a in FIG. 5.
Figure 7A:
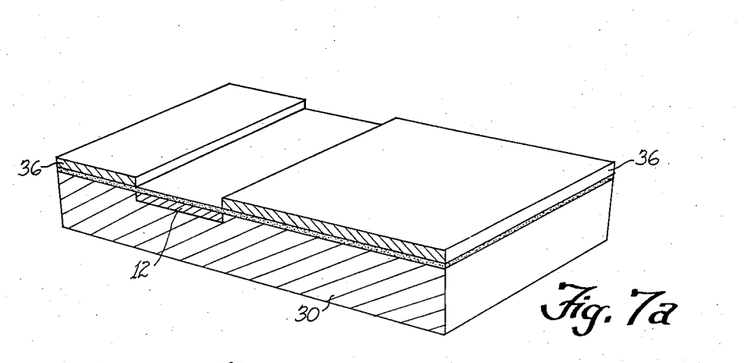
FIGS. 7a-7b are sectional views of the cell of FIG. 5 taken along the line a—a, at various stages in the manufacture thereof.
Figure 7B:
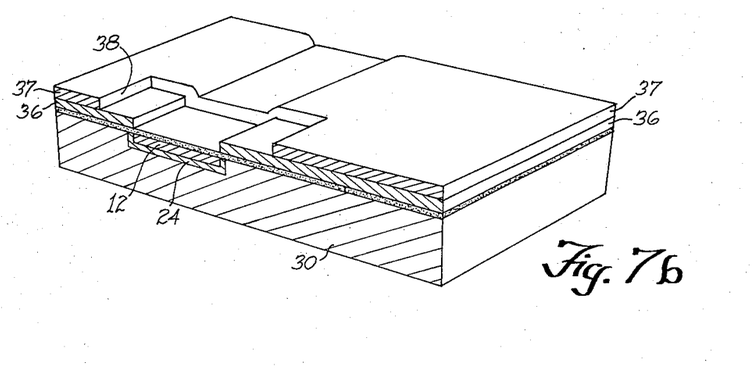

Another embodiment of features of the invention is seen in FIGS. 5, 6a and 6b. This double level poly memory cell is like that of FIG. 1 but does not employ a V-groove. In this case, the advantage of added capacitance magnitude and precise definition of a short channel will not be present, but still a rather small cell can be constructed. The same reference numerals are used for like parts, compared to FIGS. 1, 3a and 3b. A process for making this cell is shown in FIGS. 7a and 7b. As before, a slice is subjected to an initial thermal oxidation to produce an oxide layer 31, and a photoresist implant mask is formed. N+ and P+ implants are then performed, using the same mask. Lateral diffusion of the P+ impurity, as by a heat treatment, creates the channel region 23 (the same region on the other side of the bit line 12 has no function). Alternatively, rather than by implant, the N+ and P+ regions may be formed by diffusion, using a hole etched in the oxide 31 as a diffusion mask; in this case, oxide would be subsequently regrown over this opening. Channel stop may be created by a separate implant, or by a diffusion simultaneous with the P+ diffusion. Thereafter, first level poly is deposited and patterned to produce the line 19, this poly is oxidized, and second level poly is deposited and patterned to produce the line 13.

In the embodiment of FIGS. 5, 6a and 6b, just as before, the inverted region 17 creates one end 16 of the source-to-drain path of the transistor 10.

In the process for making either of the devices thus far described, the first and second level poly layers are subjected to N+ diffusion or implant, just after deposition and before patterning, to lower the resistance of those layers, according to standard practice.

Figure 8:
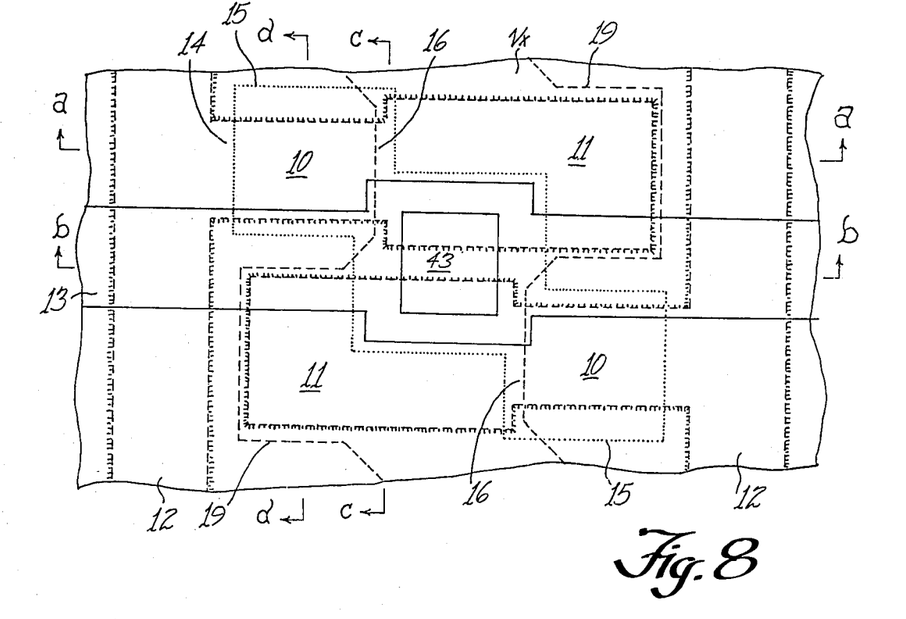
FIG. 8 is a plan view of a very small area of a semiconductor chip, showing two memory cells according to another embodiment of the double level poly RAM cell of the invention.
Figure 9:
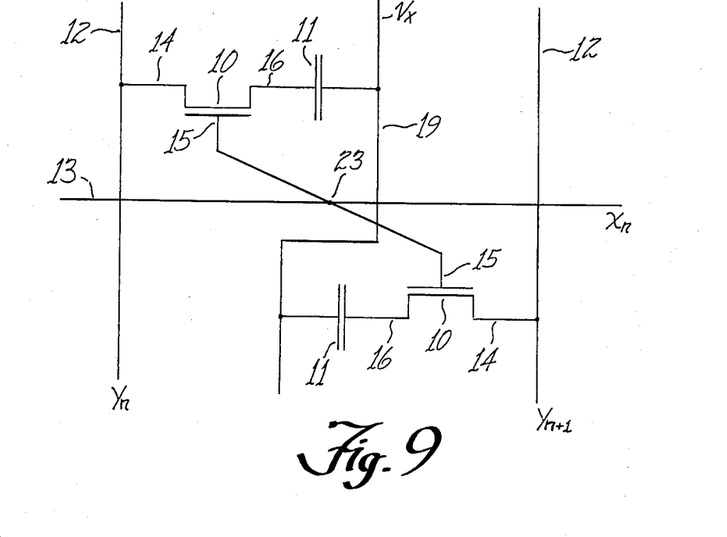
FIG. 9 is an electrical schematic diagram of the cells of FIG. 8.
Figure 10A:
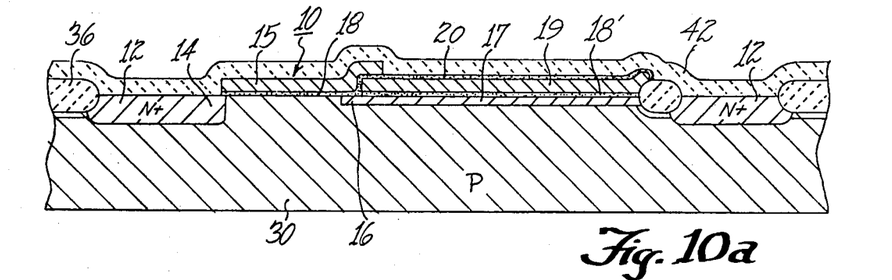
FIGS. 10a-10d are sectional views of the device of FIG. 8, taken along the lines a—a, b—b, c—c and d—d of FIG. 8 respectively.
Figure 10B:
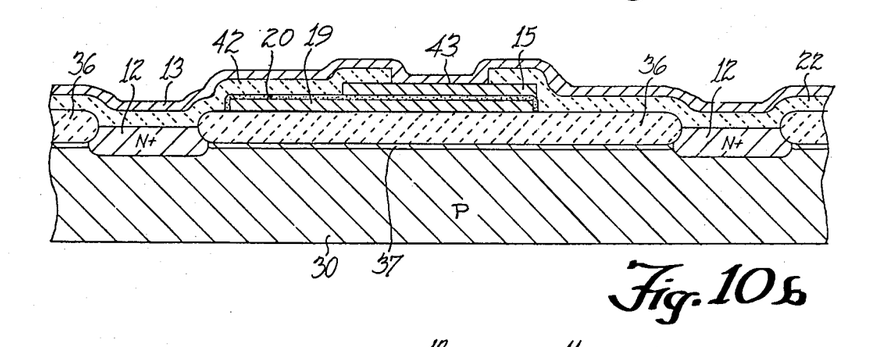
Figure 10C:
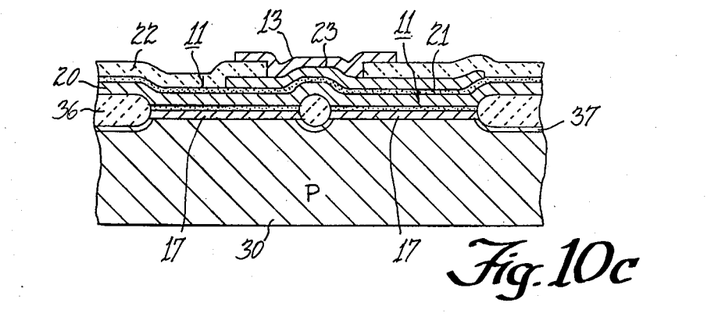
Figure 10D:
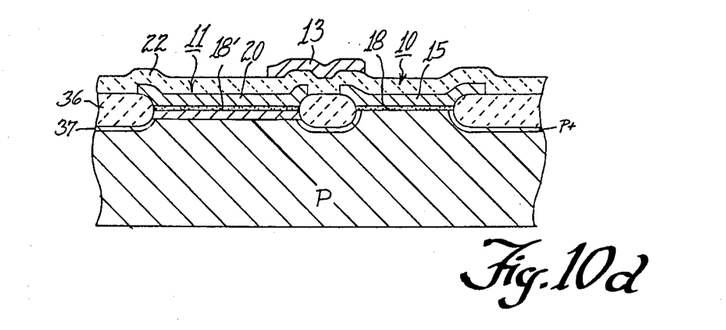

Referring to FIG. 8, an MOS RAM cell according to another embodiment having features of the invention is illustrated in physical layout. As above, each cell includes an MOS access transistor 10 and a storage capacitor 11, as also seen in the electrical schematic diagram of FIG. 9. Sense lines 12 are provided by N+ diffused regions; these lines are the Y select lines which connect to a large number of the cells in a column. For example, there may be 128 or 256 cells in a column, each having a transistor 10 and a capacitor 11 connected to a sense line 12. A sense amplifier of the type shown in U.S. patent application Ser. No. 691,734, now abandoned, filed June 1, 1976 by White and Kitagawa, assigned to Texas Instruments, would be included at the center of each column or sense line. A metal strip is the X address or row select line 13, and this line is connected to all the gates of all transistors in a row, for example one hundred twenty-eight in a 16K RAM. The area occupied by the two cells of FIG. 1 is no more than about one mil squared, or one-half square mil per cell.

As best seen in FIGS. 10a–10d, along with FIG. 8, each MOS transistor 10 includes an N+ diffused region 14 which forms the source (or drain). The N+ region 14 is part of the sense line 12 which is an elongated continuous diffused N+ region. Further, the transistor 10 includes a gate 15 created by the second-level polycrystalline silicon. The drain 16 of the MOS transistor is created by the edge of an implanted inversion region 17 beneath the capacitor 11. The implanted region 17 provides an important feature of this embodiment in that the voltage needed to invert this region is much less than previously required. A thin silicon oxide layer 18 functions as the gate insulator for the MOS transistor 10, and a separate thin oxide layer 18' provides the dielectric of the capacitor 11. According to one feature of the invention, the oxide layers 18 and 18' may be of different thicknesses. The upper plate for the capacitor 11 is provided by the first-level polycrystalline silicon which is an elongated strip 19 connected to a supply voltage Vx which may be about one-half Vdd, according to one aspect of this embodiment. It is perferable that the implant region 17 extends beyond the edge of the first level poly 19 to avoid a high resistance gap at the location 16. A layer 20 of silicon oxide separates the first and second levels of polysilicon, and a thick layer 42 of silicon oxide covers both layers of polysilicon as well as the entire chip. As seen in FIG. 3b, a metal strip which forms the row address line 13 overlies the layer 42 and extends down to make contact with the second level poly 15 at a contact location 43.

A method of making the cell of FIG. 8 will now be described with reference to FIGS. 11a–11g. The starting material is a slice of monocrystalline, semiconductor grade silicon which is about 3 inches in diameter and 50 mils thick; only a very small bar 30 of the silicon slice is shown in the FIGURES, and this bar is greatly distorted in dimensions. The small area of the bar 30 which is seen in FIGS. 11a–11g contains one cell (or two adjacent cells in FIG. 8) and this area has a width of less than one mil. The area occupied by 16K or 16384 cells plus sense amplifiers, decode circuitry, input/output buffers, bonding pads, and the like, preferably would be less than 30,000 mils square. The area per cell in this case should be less than one mil square, preferably about one-half mil. In the actual scale, the various layers and regions in FIGS. 11a–11g would be very thin compared to the width dimensions.

Figure 11:
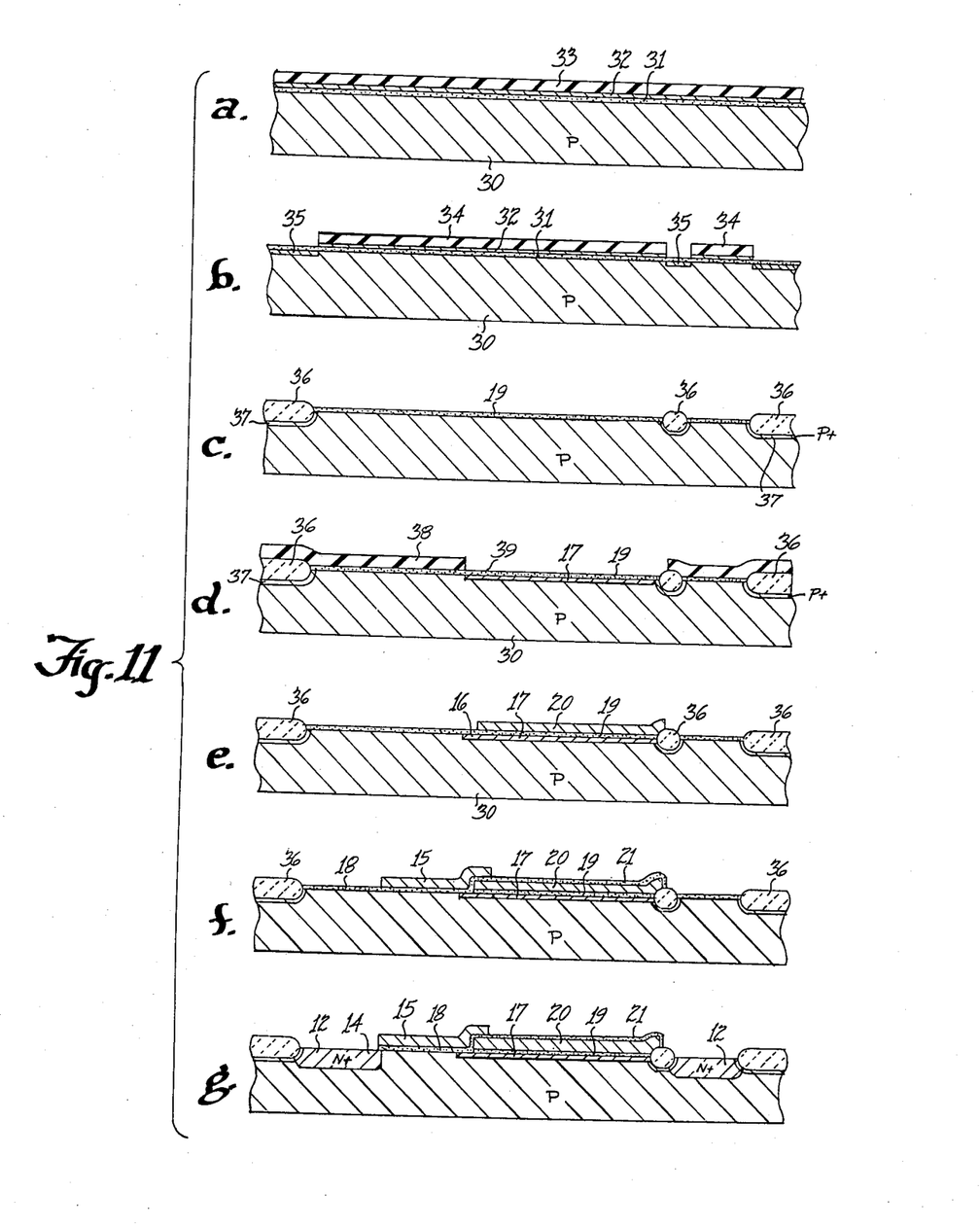
FIGS. 11a-11g are sectional views of the cell of FIGS. 8 and 10a-10d, taken along a—a, at successive stages in the manufacture thereof.

The silicon slice is first oxidized by placing in a furnace in an oxidizing atmosphere at about 1000° C. for a time sufficient to create a thin layer 31 of silicon oxide of about 1000 Å thickness. A layer 52 of silicon nitride $Si_3N_4$ is then applied over the oxide by exposing the slice to an atmosphere of silane and ammonia in an rf plasma discharge. The nitride layer also has a thickness of about 1000 Å. A coating 53 of photoresist is applied over the nitride; typically the photoresist is KMER or Kodak Metal Etch Resist. The layer 53 is exposed to ultraviolet light through a mask which is prepared to define the desired pattern of the "moats" and field oxide areas. The photoresist 53 is developed, leaving areas 54 in place as seen in FIG. 11b. This slice is subjected to a selective etchant, such as a plasma etch technique, which will remove silicon nitride but will not attach the photoresist areas 54 or the silicon oxide layer 31. The slice is next subjected to an ion implant step, wherein boron atoms are implanted via a beam of about 100 KeV at a dosage of about $10^{12}$ atoms per $cm^2$ to create shallow P+ region 55 in the areas not masked by the photoresist 54 and the nitride 52. The slice is then subjected to a lengthy oxidation operation, several hours at 900° C. in steam, whereby thick field oxide regions 56 are created as seen in FIG. 11c. The nitride layer 52 masks the oxidation where it exists, but in the exposed areas the silicon surface is consumed to a depth of about 5000 Å, growing a layer 56 of about 10,000 Å. The original P+ region 55 is consumed, but boron is diffused ahead of the oxidation front to create P+ regions 57 beneath all of the field oxide regions 56. These regions 57 function as channel stops, preventing parasitic transistors from being created. The portions of the nitride layer 52 are next removed in a hot phosphoric acid etch, and the oxide 31 is removed in a hydrogen fluoride etch. The thin dielectric oxide layer 18' is thermally grown at a thickness of about 500 Å over the entire exposed surface of the slice, without masking. Referring now to FIG. 11d the slice is coated with a photoresist layer 58, which is exposed to uV light through a mask which blocks the areas 59 above what are to be the implant or capacitor regions 17. Next, phosphorus is implanted at about 150 KeV at a dosage of $10^{12}$ per $cm^2$, using the photoresist as a mask, resulting in implanted regions 17 which are of the same form used for depletion load transistors. The remaining photoresist is then removed and polycrystalline silicon is deposited over the entire slice, using a process of decomposition of silane in a reactor, to a thickness of about 0.5 micron. This poly layer is subjected to a phosphorous diffusion to lower its resistance, then is patterned as seen in FIG. 11e using photoresist masking and etching to define first level polycrystalline silicon strips 19. The mask used in this operation is created to define the first level poly Vx line of FIG. 8. It is the left most side of the region 17, and not the left edge of the poly, which defines the drain 16 of the MOS transistors of the storage cells of FIG. 10a. It is important that the area 16 of the implanted region 17 extends beyond the left edge of the poly layer 19. Referring to FIG. 11f the gate oxide layer 18 is next created, either by stripping the exposed part of the layer 18' or by growing additional thermal oxide, to provide a gate oxide which is about 1000Å in thickness, contrasted with the capacitor dielectric layer 18' which is only about one-half as thick. During growth of the additional thermal oxide, a coating 20 of oxide is formed over the exposed top surface of the poly layer 19. This thermal oxide need not be patterned and avoids mask alignment problems.

The next step is deposition of the second level poly. To this end, the entire slice is coated with polycrystalline silicon, perhaps about 10,000Å in thickness, in a reactor as before. The slice is next coated with photoresist and exposed through a mask which defines the pattern of the second level poly, i.e., the gates 15 of the MOS transistors and the connections to the contact 43. The unwanted second level poly layer is then etched, using the developed photoresist as a mask for an etchant which attacks silicon but not silicon oxide. Then, the slice is subjected to a short etch step to remove the remanents of the gate oxide layer 18 on exposed areas of the silicon surface, where diffused N+ regions are to be created.

The slice is now subjected to a phosphorus diffusion operation using conventional techniques, whereby N+ regions 12 and 14 are produced. The exposed polysilicon layer 15 is also heavily doped by this operation. The depth of this diffusion is about 8000 Å. The edge of the gate oxide 18 defines the edge of the channel of the MOS transistor. After the N+ diffusion, the entire slice is covered with a thick layer 42 of silicon oxide, using a low temperature deposition operation so that further diffusion of the impurities in regions 12, 14 and 57 does not occur. The thick oxide coating 42 is patterned, using photoresist, to create the openings for contact area 43, then a thin layer of aluminum is deposited on the entire slice and patterned using photoresist to leave the metal strip 13. This essentially completes the manufacturing process, although it is understood that the slices would be coated with a protective layer, scribed, broken into individual chips, and mounted in packages, according to conventional practice in the industry.

Due to the fact that the contact area 43 overlies the Vx line 19 or first level poly, the cell area is smaller than possible with single level poly cells. Reduction in cell size is also permitted because the capacitor areas can be underneath the contact area 43. Further, with the self-aligning process and the cell layout shown there is a lack of criticallity in the mask positioning for certain of the layers. It does not matter that the mask which defines the first level poly 19 would miss the edge of the moat which defines the capacitor 11, in either direction. The mask which defines the second level poly can overlap the first level in the N+ moat area 14 without disaster. The positioning of the opening 43 is noncritical, as is that of the mask which defines the metal strip 13.

In prior one-transistor cells, the electrode corresponding to the line 19 must be connected to Vdd (usually +12 v) to create an inversion layer on the silicon surface that can accept a logic "1" storage voltage of up to one Vt below Vdd. In the cell of the invention, the lower region of the storage capacitor is implanted with the appropriate type of dopant or otherwise formed to exhibit depletion mode characteristics or a tendency to invert at low voltage or with Vss in the line 19; for example, phosphorus may be implanted in the region 17 for the N-channel process. Thus, a voltage lower than Vdd can be connected to the poly electrode 19 of the storage capacitor to accept the same "1" level storage voltage. The pinch off voltage or implant dosage required for the MOS storage capacitor must be high enough so that at any selected Vx the channel will not be pinched off at any storage Vs. Vx is the voltage on the capacitor poly layer 50 or 20.

Figure 12A:
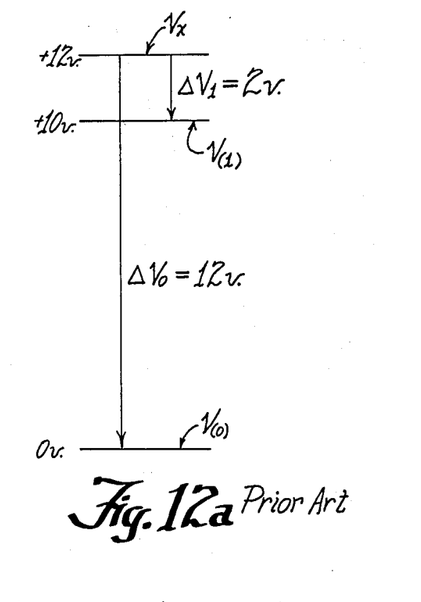
FIGS. 12a and 12b are graphic representations of voltages appearing in the cell of FIGS. 8-11 in operation thereof.
Figure 12B:
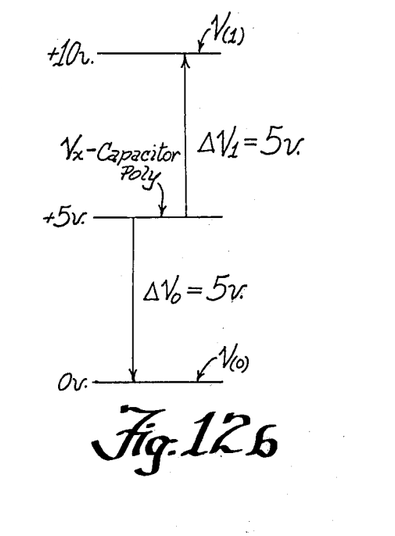

Reduction in electric field intensity in the storage capacitor thin oxide may be illustrated with example voltages. Assume that Vdd= +12 v, Vx= +5, a stored logic "1" or V(1) is +10 v and a stored logic "0" or V(0) is 0 v. In this case the maximum voltage across the storage capacitor oxide in a conventional cell is 12 v when "0" is stored. The maximum voltage for the cells of this invention is only 5 v when either a "1" or a "0" is stored, providing a 58% reduction in voltage or electric field intensity, as illustrated in FIGS. 12a and 12b. Here ΔV1 is the voltage across the storage capacitor oxide when the stored data is a "1," and ΔV0 when the stored data is a "0."

When a small cell size is most important, the field intensity reduction provided by the cell of the invention can be used to reduce the cell area because the oxide thickness can be reduced by 58% (for the example above) while maintaining the same field intensity. This means that the storage capacitance per unit area will be 58% higher or the storage capacitance area will be 58% smaller for the same storage capacitance and field intensity. In one example, this permitted the per cell area in the embodiment of FIG. 8 to be reduced from 0.725 square mil to 0.525 square mil. Even small cells result in the embodiment of FIG. 1.

In the example above, the Vx voltage was equal to Vcc for convenience. However, Vx can be set at any level from Vss or 0 v up to Vdd, as long as the depletion threshold is properly adjusted through ion implant to achieve the maximum charge storage capacity. Instead of by ion implant, the resistivity of the starting material may be selected as a high level, perhaps 20 ohm-cm, so the region 17 inverts with Vss in the line 19.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. In an N-channel silicon-gate MOS memory cell of the type formed at a face of a silicon body and having one MOS transistor and capacitance means, the MOS transistor including a polycrystalline silicon gate and including a source-to-drain path formed in said face, a heavily doped N+ region as one end of the source-to-drain path in said face, the N+ region also forming an elongated sense line running generally parallel to said face, the capacitance means including a polycrystalline silicon plate which is separated from said face by a thin silicon oxide dielectric and including a capacitor region in said face beneath said plate, the plate being part of an elongated strip of polycrystalline silicon which forms part of the capacitance means of a number of like cells along said face, the elongated strip running generally parallel to the sense line, the strip being connected to a reference potential, and elongated conductive means connected to the gate and extending along the face, the improvement comprising:

an anisotropically-etched V-groove in said face of the silicon body, the capacitor region being defined in the surface of the V-groove, and the source-to-drain path of the MOS transistor being defined in a side wall of the V-groove, the gate being spaced from the capacitor region, first and second levels of polycrystalline silicon included in the cell, with the second level at least partially overlying the first level but insulated therefrom, the first level providing said plate and said elongated strip, the second level providing the gate of the MOS transistor, the other end of the source-to-drain path of the MOS transistor being provided by an edge of the capacitor region without a heavily-doped N+ region.

2. In a memory cell according to claim 1, the elongated conductive means being defined by the second level polycrystalline silicon.

3. In a memory cell according to claim 1, the cell being characterized by the absence of a metallization level and metal-to-poly silicon contacts.

4. In a memory cell according to claim 1 the capacitor region being an implanted region having a low threshold voltage.

5. In memory cell according to claim 1 the capacitor region being an inverted region of the original silicon body and the reference potential being a voltage of near zero volts.

6. A semiconductor memory cell of the type having an MOS transistor and an MOS capacitor, comprising a semiconductor body having a major face, an anisotropically-etched V-groove in said face, the capacitor being formed in the V-groove by an upper plate in the form of a conductive layer overlying a dielectric and a lower plate in the form of an inverted surface-adjacent region of the semiconductor material in the V-groove, the MOS transistor being formed in the V-groove by a heavily-doped region of one type and a buried region of the other type exposed at a side wall of the V-groove along with a gate overlying the exposed buried region but separated therefrom by a gate insulator.

7. A memory cell according to claim 6 wherein the conductive layer and the gate are both polycrystalline silicon.

8. A memory cell according to claim 7 wherein two levels of polycrystalline silicon are provided, one overlying the other.

9. A memory cell according to claim 8 wherein the MOS transistor has a source-to-drain path, one end of which is the region of one type and the other end of which is the inverted region in the V-groove.

* * * * *